United States Patent [19]

Amada et al.

[11] 4,223,389
[45] Sep. 16, 1980

[54] RECURSIVE DIGITAL FILTER HAVING MEANS TO PREVENT OVERFLOW OSCILLATION

[75] Inventors: Eiichi Amada, Kokubunji; Makoto Ohnishi, Tokyo, Japan

[73] Assignee: Hitachi, Ltd., Japan

[21] Appl. No.: 909,066

[22] Filed: May 24, 1978

[30] Foreign Application Priority Data

Jun. 3, 1977 [JP] Japan .................................. 52-64819

[51] Int. Cl.² .......................... G06F 15/34; G06F 7/38
[52] U.S. Cl. ....................................... 364/724; 364/745
[58] Field of Search .................................. 364/724, 745

[56] References Cited

U.S. PATENT DOCUMENTS

| | | | |
|---|---|---|---|
| 3,676,654 | 7/1972 | Melvin | 364/724 |
| 3,725,687 | 4/1973 | Heightley | 364/724 |
| 3,749,895 | 7/1973 | Kao | 364/745 |
| 3,777,130 | 12/1973 | Croisier et al. | 364/724 |
| 4,034,196 | 7/1977 | Butterweck et al. | 364/745 |

*Primary Examiner*—David H. Malzahn
*Attorney, Agent, or Firm*—Craig & Antonelli

[57] ABSTRACT

This invention has been made in order to prevent the malfunction due to an overflow, of a combinatorial type recursive digital filter whose feedback side is of the second or higher order. Means for detecting the overflow of the output of an arithmetic unit which executes an addition within the filter is additionally provided, and when the overflow has developed, the contents of shift registers for delay on, at least, the feedback side are reset by an output from the detecting means.

9 Claims, 10 Drawing Figures

RECURSIVE DIGITAL FILTER HAVING MEANS TO PREVENT OVERFLOW OSCILLATION

LIST OF PRIOR ART (37 CFR 1.56 (a))

The following references are cited to show the state of the art:
1. U.S. Pat. No. 3,777,130 (Dec. 4, 1973)
2. U.S. Pat. No. 3,676,654 (July 11, 1972)
3. A. N. Willson, JR.; "Some Effects of Quantization and Adder Overflow on the Forced Response of Digital Filters", BSTJ, April, 1972.

BACKGROUND OF THE INVENTION

1. Field of the Invention

This invention relates to the prevention of an abnormal operation of a recursive digital filter.

DESCRIPTION OF THE PRIOR ART

In recent years, owing to the progress of the semiconductor technology, digital filters (hereinbelow, abbreviated to "DFs") have come to be actively used instead of analog filters. The DF produces an output signal by digitally subjecting a digital signal to delay, multiplication by a coefficient, or addition or subtraction. There are various types of DFs.

Letting x(n) denote the digital input signal at the n-th sampling point, and y(n) denote the digital output signal, the DF carries out the following operation:

$$y(n) = \sum_{k=0}^{M} a_k \cdot x(n-k) + \sum_{k=1}^{N} b_k \cdot y(n-k) \quad (1)$$
$$\text{and } a_M \cdot b_N \neq 0.$$

where n represents natural number, $a_k$ and $b_k$ coefficients, and $a_M, b_N \neq 0$. M is a order of the numerator of the transfer function of the DF, and N is a order of the denominator thereof, in this case, Mth order/Nth order indicates a order of the DF.

Here, the DF is called the "recursive DF" (hereinafter, written as "RDF"). Supposing by way of example that the coefficient N is 2 (two), the particular RDF is termed an RDF the feedback side of which is of the second order or an RDF in which the order of the feedback side is 2 (two). The RDF is described in detail in, for example, U.S. Pat. No. 3,777,130 mentioned in the List of Prior Art. The RDF disclosed in the U.S. patent is called the "combinatorial type RDF."

In general, the RDF is constructed of multipliers, an adder, and delay elements. In this respect, the bit length of the delay element is finite. Therefore, when an "add" result in the adder exceeds an amplitude permitted for y(n), an overflow arises and a nonlinearity takes place between y(n) and x(n). Once the overflow has developed, there is the possibility that the influence will remain in the delay elements on the feedback side and that the overflow will occur in a sustained fashion. In a state in which no input exists, the sustenance of the overflow becomes the so-called overflow oscillation. On the other hand, in a state in which an input exists, the output becomes different from a value calculated from Eq. (1), and the RDF falls into a malfunction.

A technique for reducing the influence of the overflow is a method of U.S. Pat. No. 3,676,654 cited in the List of Prior Art. According to this method, the delay element is used on the half-scale (it is used at or below a half of the maximum value of numbers which can be stored), and when the "add" result has exceeded the half-scale, it is reset. As will be stated later, however, this method does not always prevent the abnormal operation of the RDF. Moreover, this method needs to employ delay elements in a bit number greater than that corresponding to the maximum allowable input amplitude value, and the quantity of hardware becomes large.

As another technique, there is a method described in the article by A. N. Williams mentioned in the List of Prior Art. This method also suffers difficulties in regard to the point of the prevention of the abnormal operation.

SUMMARY OF THE INVENTION

An object of this invention is to provide an RDF with its feedback side having the second or higher order wherein an abnormal operation due to an overflow can always be prevented in situations where the overflow can be attributed to the fact that delay elements of the RDF have only a finite bit length.

In order to accomplish the object, according to this invention, in an RDF the feedback side of which is of the second or higher order, that is, in an RDF into which a digital input signal x(n) consisting of a plurality of bits is entered and which provides a digital output signal y(n) satisfying $$y(n) = \sum_{k=0}^{M} a_k \cdot x(n-k) + \sum_{k=1}^{N} b_k \cdot y(n-k)$$

in the case where $a_M$, $b_N$ are not equal to zero, and N is greater than or equal to two, there are disposed means for detecting that an "add" result has exceeded the maximum allowable amplitude of delay elements which delay x(n−k) and y(n−k) to generate x(n−k−1) and y(n−k−1), and means for setting the content of the delay element on the feedback side, i.e., the delay element for delaying y(n−k), to a specified state by an output of the detecting means.

DESCRIPTION OF THE PREFERRED EMBODIMENTS

Before describing this invention in detail, the principle of an RDF and the prior art described in U.S. Pat. No. 3,676,654 will be explained with reference to the drawings.

Figure 1:
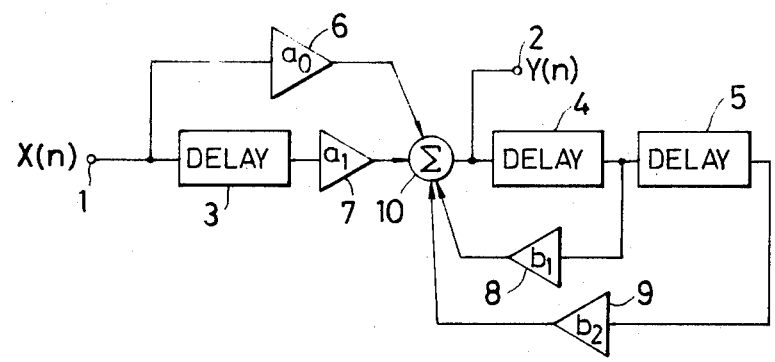
FIG. 1 is a schematic circuit arrangement diagram showing the principle of a recursive digital filter.

FIG. 1 illustrates by way of example the fundamental construction of a first order/second order RDF. In the figure, numeral 1 designates an input terminal of the RDF, and numeral 2 an output terminal thereof. Numerals 3, 4 and 5 indicate delay elements such as shift registers for delaying digital data by a sampling period, and the delay elements 4 and 5 are those on the feedback side. Numerals 6, 7, 8 and 9 indicate coefficient multipliers. Shown at 10 is an adder.

In this construction, Eq. (1) becomes:

$$y(n) = a_0 x(n) + a_1 x(n-1) + b_1 y(n-1) + b_2 y(n-2) \quad (2)$$

Figure 2:
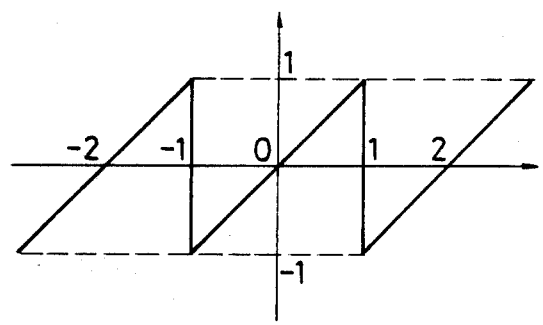
FIG. 2 is a waveform diagram for explaining the nonlinearity of an output of the recursive digital filter ascribable to an overflow.

In the construction, the bit length of the delay element is finite. Therefore, when the "add" result of the adder 10, that is, y(n) of Eq. (2) exceeds a permitted amplitude, an overflow occurs and a nonlinearity as shown in FIG. 2 arises in the actual output of the adder 10. In FIG. 2, the axis of abscissas represents y(n) of Eq. (2), while the axis of ordinates the output of the adder 10. In the illustration, the maximum value of numbers which the delay element can store therein is normalized to 1 (one). In the circuit, once the overflow has developed, it is highly possible that the influence will remain in the delay elements 4 and 5 on the feedback side and that the overflow will take place in a sustained manner.

Figure 3:
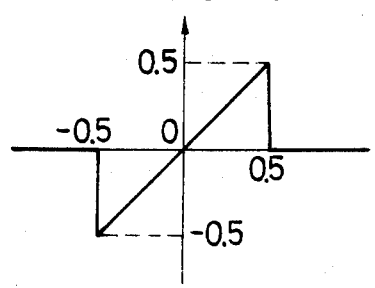
FIG. 3 is a waveform diagram for explaining a technique for preventing the malfunction of the recursive digital filter ascribable to the overflow.

In the technique of U.S. Pat. No. 3,676,654 for moderating a malfunction due to the overflow, when the "add" result has exceeded a half of the maximum value of the numbers which the delay element can store therein (a half of the maximum allowable input value), the "add" result is reset. Now, operations within the RDF are supposed to be fixed-point operations, the maximum value of the numbers which the delay element can store therein is normalized to 1 (one), and normalization errors are neglected. Then, the characteristic of the RDF employing this method becomes as illustrated in FIG. 3. In the figure, the axis of abscissas represents y(n) of Eq. (2), and the axis of ordinates the output of the adder 10.

As an example of the RDF employing this method, the following is considered:

$$y(n) = 1.5 y(n-1) - 0.95 y(n-2) + x(n) \quad (3)$$

and $$x(n) = \begin{cases} 0.02 & (n = 4m, 4m+1) \\ -0.02 & (n = 4m+2, 4m+3) \end{cases}$$

where m denotes an integer.
Assuming:

$$y(-1) = 0, y(0) = 0.4$$

from FIG. 3 as well as Eq. (3) the output of the adder 10 becomes:

$$y(n) = \begin{cases} 0 & (n = 4m+1, 4m+3) \\ 0.4 & (n = 4m) \\ -0.4 & (n = 4m+2) \end{cases}$$

These are different from outputs which are expected from Eq. (3) only. More specifically, according to Eq. (3), the following ought to hold:

$$y(1) = 1.5 y(0) - 0.95 y(-1) + x(1)$$
$$= 0.62$$
$$y(2) = 1.5 y(1) - 0.95 y(0) + x(2)$$
$$= 0.53$$

Since, however, 0.62 > 0.5, it becomes from FIG. 3 that y(1) = 0 and that y(2) = −0.4.

This fact indicates that the method disclosed in U.S. Pat. No. 3,676,654 is not perfect in regard to the prevention of the abnormal operation of the RDF. The cause therefor is that, when the "add" result of the adder has exceeded the half-scale, the method resets only the "add" result. The imperfection takes place in the case where the feedback side of the RDF is of the second or higher order, and as the order increases, the prevention of the abnormal operation is more often impossible.

In addition, according to the above method, the delay elements can only be used at or below half of the maximum value of the numbers which they can store therein, so that the quantity of hardware of the delay elements becomes large.

Figure 4:
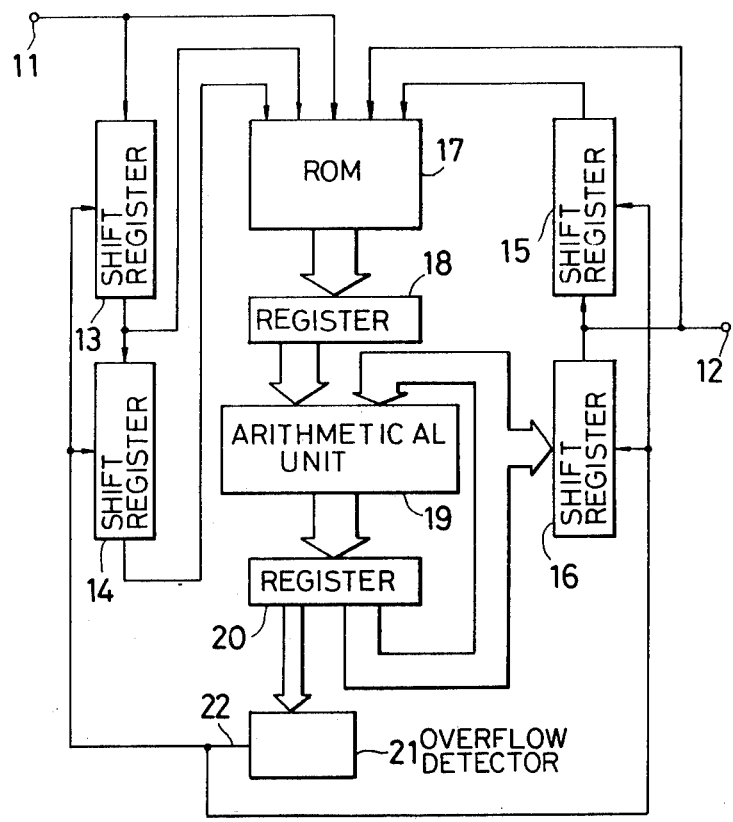
FIG. 4 is a schematic circuit arrangement diagram of an embodiment of this invention.

FIG. 4 shows a schematic circuit arrangement diagram of an embodiment of this invention. In the present embodiment, this invention is applied to a second order/second order combinatorial type RDF. Regarding the construction of the combinatorial type RDF, reference is made to U.S. Pat. No. 3,777,130. Referring to FIG. 4, numeral 11 designates an input terminal of the RDF, and numeral 12 an output terminal thereof. Numerals 13, 14 and 15 indicate shift registers which serve as delay elements for delaying digital data by a sampling period, and especially the shift register 15 is the delay element on the feedback side. Numeral 16 denotes a shift register for serialization, which is also located on the feedback side. Numeral 17 represents a read only memory (ROM) as storage means, numerals 18 and 20 registers as temporary holding means, and numeral 19 an arithmetic unit for executing an addition. Numeral 21 represents an overflow detector. The register 18 may be omitted so as to enter an output of the ROM 17 directly into the arithmetic unit 19. In the figure, thick lines denote parallel data, while fine lines indicate series data.

The operation of the combinatorial type RDF of the above circuit arrangement is as stated below. In the case of the second order/second order RDF, Eq. (1) is reduced as follows:

$$y(n) = a_0 x(n) + a_1 x(n-1) + a_2 x(n-2) + b_1 y(n-1) + b_2 y(n-2) \quad (4)$$

Now, the maximum value of input signals x(n) is normalized to 1 (one), and the input signals are assumed to be expressed by a 2's complement notation including B bits. Then, $$x(n) = -x_n^0 + \sum_{j=1}^{B-1} x_n^j 2^{-j} \quad (5)$$

$x_n^j$ is a value of the (j+1)-th bit as reckoned from the MSB of the input signal x(n), and is expressed by 0 (zero) or 1 (one). $x_n^0$ is a sign bit. By substituting Eq. (5) into Eq. (4) and making arrangement, $$y(n) = \sum_{j=1}^{B-1} 2^{-j} \phi(x_n^j, x_{n-1}^j, x_{n-2}^j, y_{n-1}^j, y_{n-2}^j) - \phi(x_n^0, x_{n-1}^0, x_{n-2}^0, y_{n-1}^0, y_{n-2}^0) \quad (6)$$

where $$\phi(x_n^j, x_{n-1}^j, x_{n-2}^j, y_{n-1}^j, y_{n-2}^j) = a_0 x_n^j + a_1 x_{n-1}^j + a_2 x_{n-2}^j + b_1 y_{n-1}^j + b_2 y_{n-2}^j$$

Values of the $\phi$ are kept written in the ROM 17 in FIG. 4. The $\phi$ is read out by using $x_n^j$, $x_{n-1}^j$, $x_{n-2}^j$, $y_{n-1}^j$ and $y_{n-2}^j$ as addresses, and is temporarily stored in the register 18. In the arithmetic unit 19, the data of the register 18 as shifted by 1 (one) bit and data temporarily stored in the register 20 are sequentially added. Upon completion of one sampling period, data in the register 20 represent y(n) of Eq. (6), and they are transmitted to the serializing shift register 16. It is to be understood that, in the combinatorial type RDF, the data which are transmitted from the register 20 to the shift register 16 are consequently delayed by one sampling period. The bit lengths of the register 20 and the arithmetic unit 19 have a margin with respect to the bit lengths of the shift registers for delay 13–15 and the shift register for serialization 16. This is based on the possibility that an intermediate calculated result to be latched in the register circuit 20 will become greater than a final operated result. The surplus bit length is determined by the coefficients $a_0$, $a_1$, $a_2$, $b_1$ and $b_2$ of the RDF. The overflow detector (hereinbelow, abbreviated to "OFD") 21 exploits the additional bits in excess and the sign bit of the input signal.

Figure 5:
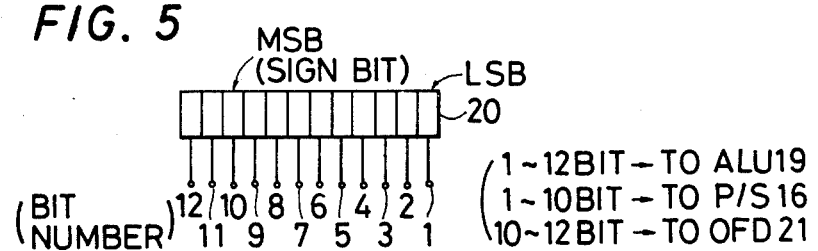
FIGS. 5 and 7 are diagrams for explaining the operation of the embodiment in FIG. 4.
Figure 6:
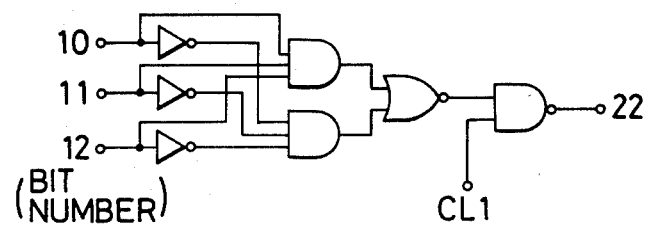
FIG. 6 is a circuit arrangement diagram of an embodiment of an essential portion in FIG. 4.

It is now assumed that the bit length of the digital input and output signals is 10 (ten) bits and that the margin in the register 20 as well as the arithmetic unit 19 is 2 (two) bits. The state of connection among the register 20, the arithmetic unit 19 and the OFD 21 in this case is illustrated in FIG. 5. FIG. 6 shows a concrete circuit arrangement of the OFD 21. Data of #10–#12 bits in the register 20 as shown in FIG. 5 are entered into the OFD 21. In consequence of illustrated logical operations, an overflow detection signal is obtained at an output terminal 22. The overflow detection signal becomes a reset pulse which is impressed on the shift registers 13, 14, 15 and 16. In a case where an overflow has occurred, the data of #10–#12 bits become non-coincident and "0" appears at the output terminal 22. CL1 in FIG. 6 indicates a control pulse for rendering the OFD 21 operative when the operation of one word has been terminated. A control system for generating the control pulse is omitted from the illustration.

Figure 7:
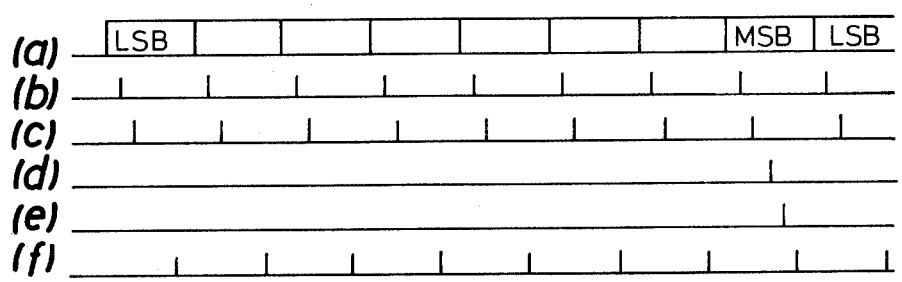

FIG. 7 illustrates the relations between the input signal and control pulses at various parts in the circuit arrangement of FIG. 4. In FIG. 7, (a)–(f) indicate the digital input signal, clock pulses of the register 18, clock pulses of the register 20, clock pulses for loading data of #1–#10 bits in the register 20 into the parallel-to-serial converting shift register 16 in parallel, the control pulse CL1, and clock pulses of the shift registers 13 through 16. When the control pulse CL1 is impressed and the output of the output terminal 22 of the OFD 21 becomes "0," the reset pulse is impressed on reset terminals of the shift registers 13, 14, 15 and 16. All the shift registers 13 through 16 are reset, and the RDF restarts computations from the state under which the initial value is zero. Thereafter, the RDF operates stably for input signals which do not cause any overflow.

In the above embodiment, all the shift registers 13 through 16 have their contents set to zero when reset. However, the set state is not restricted to the "all zero" state, but a different specific state can be sometimes adopted in order to prevent the abnormal operation.

Besides, although all the shift registers are set to the specified state in the embodiment of FIG. 4, it is needless to say that the abnormal operation of the RDF can be prevented by bringing only the shift registers 15 and 16 on the feedback side into the specific state. Moreover, although the foregoing embodiment exemplifies the second order/second order combinatorial type RDF, it is a matter of course that the invention can be performed in combinatorial type RDFs in which the feedback side is of the third or higher degree.

Figure 8:
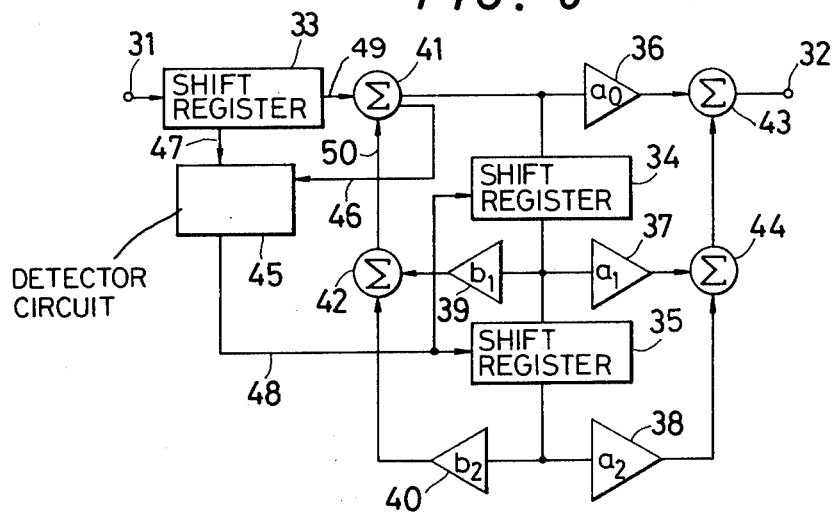
FIG. 8 is a schematic circuit arrangement diagram of another embodiment of this invention.

FIG. 8 shows a second embodiment of this invention. In the illustrated embodiment, this invention is applied to a second order/second order RDF of the standard type. The feature of the present embodiment resides in whether or not a digital input signal which is smaller than a predetermined level is detected, and that the occurrence of an overflow at the time of the smaller input signal is deemed a malfunction, whereupon the contents of delay elements are reset. Referring to the figure, numeral 31 designates an input terminal of the RDF into which a digital input signal x(n) is entered. Numeral 32 designates an output terminal from which y(n) of Eq. (4) is delivered. Numeral 33 indicates a shift register for detecting the level of the digital input signal. Shift registers 34 and 35 are delay elements for delaying data by one sampling period. Numerals 36, 37, 38, 39 and 40 indicate coefficient multipliers. Numerals 41, 42, 43 and 44 represent adders which have the same function as that of the arithmetic unit 19 in the preceding embodiment. Shown at 45 is an input level and overflow detector circuit. Numeral 46 denotes an output and carry signal of the adder 41, numeral 47 an input level detecting signal, and numeral 48 a resetting output signal. The three shift registers 33, 34 and 35 have equal bit lengths.

Figure 9:
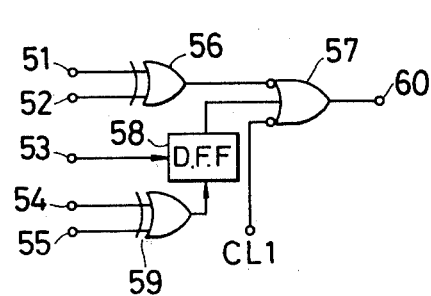
FIGS. 9 and 10 are circuit arrangement diagrams showing an embodiment of an essential portion in the embodiment of FIG. 8.

FIG. 9 shows a concrete circuit arrangement of the input level and overflow detector circuit 45. Numerals 56 and 59 designate exclusive OR circuits, numeral 58 designates a D-type flip-flop for holding an output of the exclusive OR circuit 59 for one sampling period, and numeral 57 designates an OR circuit among an output of the D-type flip-flop 58, an inverted signal of an output of the exclusive OR circuit 56 and an inverted signal of a clock pulse CL1. Numerals 51 and 52 correspond to the signal 46 in FIG. 8, and respectively indicate an output signal and a carry signal of the adder 41. Numerals 54 and 55 correspond to the input level detecting signal 47 in FIG. 8, and respectively indicate data of the MSB and the bit next thereto in the input signal entered into the shift register 33. Numeral 53 indicates a terminal to which the inverted signal of the clock pulse CL1 is applied, and numeral 60 represents an output terminal for a resetting output signal.

Figure 10:
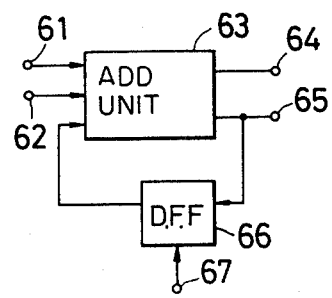

FIG. 10 shows a concrete construction of the adder 41 in FIG. 8. In FIG. 10, numeral 63 designates an "add" unit. Numerals 61 and 62 indicate terminals into which signals 49 and 50 in FIG. 8 are entered, respectively. Numerals 64 and 65 indicate terminals from which an "add" signal and a carry signal of the "add" unit 63 are delivered, respectively. Shown at 66 is a D-type flip-flop. Shown at 67 is an input terminal for a clock pulse.

The operation and function of the input level and overflow detector circuit 45 in FIG. 8 will be described with reference to FIGS. 9 and 10. As in the previous embodiment, it is assumed that the bit length of the digital input signal is 10 (ten) bits. Then, at the same time that the 10-bit input signal is entered into the level detecting shift register 33 sequentially from the LSB side, the input signal preceding by one sampling period is delivered therefrom sequentially from the LSB side. While the output of the shift register 33 is entered into the input terminals 61 and 62 of the "add" unit 63 of the adder 41 sequentially bit by bit, the "add" output signal of the adder 42 is entered bit by bit. At the output terminals 64 and 65, the "add" output signal and carry signal every bit are respectively provided. The "add" output signal is entered into the coefficient multiplier 36, and is simultaneously entered into the input terminal 51 of the input level and overflow detector circuit 45. On the other hand, the carry signal is entered into the D-type flip-flop 66 and is delayed therein by a time corresponding to one bit, the delayed signal becoming an "add" input of the "add" unit 63 and being simultaneously entered into the input terminal 52 of the input level and overflow detector circuit 45. The exclusive OR circuit 56 provides "1" when an overflow has developed, and provides "0" when not. Upon completion of the entry of the input signal into the shift register 33, the exclusive OR circuit 59 receives the data of the MSB and the bit next thereto. It provides "1" when the content of the shift register 33 exceeds ½ of the maximum level, and provides "0" when not. This output is delayed by one sampling period by means of the D-type flip-flop 58. The OR circuit 57 receives as its inputs the inverted signal of the output of the exclusive OR circuit 56, the output of the D-type flip-flop 58, and the inverted signal of the clock pulse CL1. When the input signal does not exceed ½ of the maximum level of the shift register and yet the overflow occurs, the OR circuit 57 delivers "0" to the output terminal 60 and forms the reset signal. This reset signal sets the shift registers 34 and 35 to a specified state.

The fact in the present embodiment that, in case where the input signal does not exceed ½ of the maximum level of the shift register and yet the overflow occurs, the shift registers are set to the specific state, has the following significance.

In the RDF, when a step input of large amplitude has entered, an overflow is sometimes caused transiently. Now, consider an RDF which is represented by:

$$y(n) = 1.3y(n-1) - 0.6y(n-2) + 0.25x(n) \quad (7)$$

The gain of this RDF for a d.c. input is 0.833, and no overflow takes place even when the d.c. input has an amplitude of 1 (one). More specifically, by the Z-transform of Eq. (7), $$Y = 1.3YZ - 0.6YZ^{-2} = 0.25X \quad (8)$$

Accordingly, $$Y = \frac{0.25}{1 - 1.3Z^{-1} + 0.6Z^{-2}} \cdot X \quad (9)$$

Since $X = 1$ and $Z = 1$ for the d.c. input of the unit amplitude, the following is obtained:

$$Y = \frac{0.25}{0.3} \approx 0.833$$

However, when the unit-amplitude step input series {. . . 0, 0, 1, 1, 1, 1, 1, . . . }, the response series become {. . . 0, 0, 0.25, 0.575, 0.848, 1.007, 1.051, . . . }, so that the output of the fourth period as reckoned from the input exceeds 1 (one) to give rise to the overflow.

This fact signifies that the RDF undergoes the overflow even at the time of an input signal which has an amplitude smaller than the maximum allowable input amplitude value. Therefore, whenever the overflow has occurred, the operation of the RDF is temporarily stopped inconveniently. The extent of interference due to an abnormal operation will now be considered in general. Even when, at a large-amplitude input, a smaller disturbance is entered, any considerable interference does not occur. In contrast, at a small-amplitude input, the interference due to a malfunction is great. If, at a small input level, the adder undergoes an overflow, the overflow will be attributed to a malfunction, and the contents of the delay elements ought to be reset. The second embodiment described above can meet such a request.

In the above embodiment, the input signal is compared at the rate of ½ of the maximum allowable input amplitude value. The rate, however, is not restricted to ½ but may be a different predetermined value. Of course, the second embodiment is not restricted only to the second order/second order RDF, but it is also applicable to other RDFs the feedback side of which is of the second or higher order. Needless to say, it is also applicable to the combinatorial type RDF shown in FIG. 4.

As described above in detail, in accordance with this invention, the simple circuit which can be constructed of a small number of gate circuits is additionally provided, whereby the abnormal operation of the RDF whose feedback side is of the second or higher order can be perfectly prevented.

We claim:
1. A recursive digital filter comprising:
(a) first means to which an m-bit digital input signal x(n) is applied,
(b) calculating means having an input and an output means, said input means connected to said first means, for delivering from said output means thereof a digital signal y(n) shown by a formula,

$$y(n) = \sum_{k=0}^{M} a_k \cdot x(n-k) + \sum_{k=1}^{N} b_k \cdot y(n-k)$$

where n represents a natural number, N and M are orders representing a delay of signal transmission, and $a_k$ and $b_k$ are coefficients with $a_M$, $b_N \neq 0$, and $N \geq 2$,
(c) second means including first and second delay means connected in series, said second means being connected between the output means and the input means of said calculating means for delaying an m-bit signal of said digital signal y(n) by two sampling periods or more from said input signal x(n) and for feeding back the delayed signal to the input means of said calculating means,
(d) overflow detector means connected to the output means of said calculating means and to the first and second delay means of said second means, for supplying a signal for setting the contents of both said first and second delay means into a specified state when the value of said digital signal y(n) exceeds a predetermined value, and
(e) third means coupled to said first delay means of said second means for delivering an m-bit digital signal y(n) as the output of the filter.

2. A recursive digital filter according to claim 1, wherein said first means includes at least third delay means connected to the input of said calculating means, said input signal x(n) being supplied directly to the input of said calculating means and at the same time supplied to the input of said calculating means through said third delay means which delays said input signal x(n) by k sampling periods.

3. A recursive digital filter according to claim 2, wherein the third delay means is a register.

4. A recursive digital filter according to claim 2, wherein said third delay means is connected with said overflow detector, thereby to set the contents of said third delay means into a specified state when the value of said signal y(n) exceeds a predetermined value.

5. A recursive digital filter according to claim 1, 2, or 3, wherein said specified state is zero.

6. A recursive digital filter according to claim 1, 2, or 3, wherein said calculating means comprises:
(a) said input means for said calculating means comprising a data storage means, coupled to said first means and said second means to allow data to be read out therefrom by addressing said data storage means with input and output signals x(n−k) and y(n−k), respectively, and
(b) summation means coupled to an output of said data storage means for summing the outputs of said data storage means at every sampling period thereby to output digital data y(n), which is parallel data, made up of more than m-bits, the m-bits of said digital data y(n) being supplied to said first delay means which converts the m-bit parallel data into a serial data.

7. A recursive digital filter according to claim 6, wherein said data storage means comprises a read only memory.

8. A recursive digital filter comprising:
(a) an input terminal into which an m-bit digital input signal x(n) is applied;
(b) an output terminal for delivering a digital signal y(n);
(c) calculating means, connected between said input terminal and said output terminal, for converting said input signal x(n) into said signal y(n) which satisfies, $$y(n) = \sum_{k=0}^{M} a_k \cdot x(n-k) + \sum_{k=1}^{N} b_k \cdot y(n-k)$$

where n represents a natural number, M and N are orders representing a delay of signal transmission, and $a_k$ and $b_k$ are coefficients with $a_M$, $b_N \neq 0$, and $N \geq 2$, said calculating means including,
(1) first and second delay means connected in series to each other, each of which has an m-bit data capacity,
(2) first multiplier means, connected to said second delay means, for multiplying the output signal of said second delay means by a first coefficient $b_k$,
(3) first summation means, connected between said input terminal and the output of said first multiplier means, for adding at least said input signal x(n) and the output signal of said first multiplier means and coupled to the first delay means for supplying the output thereof to said first delay means,
(4) second multiplier means, connected to said first summation means, for multiplying the output signal of said first summation means by a second coefficient a0,
(5) third multiplier means, connected to said second delay means, for multiplying the output signal of said second delay means by a third coefficient $a_k$, and
(6) second summation means, connected between said second and third multiplier means, for adding at least the output signal of said second multiplier means and the output signal of said third multiplier means, and coupled to the output terminal for supplying the output of the second summation means to said output terminal; and
(d) an overflow detector, connected to said first summation means and said first and second delay means for supplying a signal for setting the contents of said first and second delay means into a specified state when the value of the output signal of said first summation means exceeds a predetermined value.

9. A recursive digital filter according to claim 1 or 8, wherein the first and second delay means are registers.

* * * * *